(12) United States Patent
Hsu

(10) Patent No.: US 6,449,817 B1
(45) Date of Patent: Sep. 17, 2002

(54) EQUIPMENT FOR SECURING A HEAT DISSIPATOR OF CPU

(76) Inventor: Hsien-Keng Hsu, No. 1, Ta Tung Farm, Feng Ming Village, Chu Tien Hsiang, Pingtung Hsien (TW)

( * ) Notice: Subject to any disclaimer, the term of this patent is extended or adjusted under 35 U.S.C. 154(b) by 0 days.

(21) Appl. No.: 09/901,714

(22) Filed: Jul. 11, 2001

(30) Foreign Application Priority Data

Jun. 8, 2001 (TW) ...................................... 90209582 U

(51) Int. Cl.[7] .............................. A44B 21/00; F28F 7/00; F16M 11/00; H05K 7/20
(52) U.S. Cl. ........................... 24/459; 24/517; 361/704; 174/16.3; 165/80.3
(58) Field of Search .......................... 24/459, 518, 517; 361/704; 165/80.3; 174/16.3

(56) References Cited

U.S. PATENT DOCUMENTS

| | | | | |
|---|---|---|---|---|
| 5,684,676 A | * | 11/1997 | Lin | 361/704 |
| 5,860,195 A | * | 1/1999 | Wang | 24/459 |
| 5,933,326 A | * | 8/1999 | Lee et al. | 361/704 |
| 6,108,207 A | * | 8/2000 | Lee | 361/704 |
| 6,111,752 A | * | 8/2000 | Huang et al. | 361/704 |
| 6,118,661 A | * | 9/2000 | Lo | 361/704 |
| 6,257,533 B1 | * | 7/2001 | Pei et al. | 361/704 |
| 6,310,774 B1 | * | 10/2001 | Lee | 361/704 |
| 6,318,452 B1 | * | 11/2001 | Lee | 165/80.3 |

* cited by examiner

*Primary Examiner*—Victor Sakran
(74) *Attorney, Agent, or Firm*—Rosenberg, Klein & Lee

(57) ABSTRACT

A securing equipment for a heat dissipator of a CPU includes a middle pressing part, an L-shaped removing part, and a first and a second holed connecting part at two ends of the middle part. The whole body of the equipment is made by punching and pressing a stainless spring steel. The removing part sticks up from a lower end of the second part, and fixedly abuts the second part and has a hole communicating with the hole of same. The. holes of both the first and the second parts engage a respective fixing protrusion of a socket, which a CPU is fitted onto; thus, the middle pressing part presses a heat dissipator disposed on the CPU to fix same in position. The upper portion of the removing part is depressed and pushed towards the middle part to separate the second hole from the corresponding fixing protrusion for removing the securing member from the heat dissipator.

5 Claims, 5 Drawing Sheets

EQUIPMENT FOR SECURING A HEAT DISSIPATOR OF CPU

BACKGROUND OF THE INVENTION

The present invention relates to an equipment for securing a heat dissipator of CPU, and particularly to one which is made to have a single part, therefore same doesn't need assembly in manufacturing.

CPU would produce a large amount of heat when working, and the large amount of heat has to be dissipated, otherwise the CPU is likely to break down, or get damaged. Therefore, a heat dissipating equipment is fitted onto a CPU to dissipate the heat produced by the CPU when working.

One common CPU heat dissipating equipment has a flat base, and several lines of radiating fins sticking up from the upper side of the flat base. The heat dissipating equipment is fixedly disposed on the upper side of the CPU so that heat from the CPU can pass through the radiating fins to be dissipated by cooling air from an electric fan.

Referring to FIG. 6, a conventional securing equipment for a CPU heat dissipator of this kind has a middle pressing part 10 and connecting parts 101 and 102 at two ends. The equipment is made by a punching and pressing machine. The connecting parts 101 and 102 have holes 1011 and 1012 respectively. The hole 1011 of the securing equipment is connected to a fixing protrusion 201 of a socket 20, which a CPU is connected to with the middle pressing part 10 being disposed on a central passage through radiating fins 301 of the heat dissipator 30. Then, the connecting part 102 is pressed for the connecting hole 1021 to be connected to a fixing protrusion 202 of the socket. Thus, the securing equipment locks and the pressing part 10 thereof pressing the heat dissipator 30 to fix the same in position.

However, the securing equipment is found to have drawbacks as follows:

1. The computer user has to remove the securing equipment by means of suitable tools such as a screwdriver for permitting the heat dissipator 30 and the CPU 40 to be removed for maintance, replacement, or upgrading thereof. Consequently, the securing equipment is likely to get deformed after many times of removal for the frequent maintance, replacement and upgrading of the computer.
2. Furthermore, because the securing equipment is made of carbon steel, and needs heat treatment, there can be many deformed failure products in manufacturing and the heat treatment.

Referring to FIG. 7, another conventional securing equipment 50 has a middle elongated pressing part 501, and a first and a second connecting parts 502 and 503 at two ends. The connecting parts 502 and 503 have connecting holes 5021 and 5031 respectively. The second connecting part 503 further has a positioning part 504, to which an inverted-L shaped removing member 505 is connected. The connecting parts 502 and 503 are connected to a respective oen of the fixing protrusions 201 and 202 of a socket 20, which a CPU 40 is fitted to, for fixing a heat dissipator 30 on the upper side of the CPU 40 in position with the elongated pressing part 501 pressing the heat dissipator 30. To remove the securing equipment 50, the removing member 505 is depressed, and pushed inwardly of the heat dissipator 30 for the connecting hole 5031 to separate from the fixing protrusion 202; thus, the securing equipment 50 can be removed.

However, because the securing equipment 50 consists of two separate parts, an assembly thereof is needed in the manufacturing after the two parts are made by a punching and pressing machine, needing additional labor and increasing the cost of the securing equipment. And, because the two parts are made of carbon steel, they are likely to get deformed in the necessary heat treatment.

SUMMARY OF THE INVENTION

Therefore, it is a main object of the present invention to provide a securing equipment for a heat dissipating device of a CPU, which is made by means of punching and pressing a stainless spring steel, and which needs no assembly because the whole body is formed in the pressing and punching process.

And, it is another object of the present invention to provide the securing equipment with easiness of use.

The securing equipment of the present invention includes a middle pressing part a first and a second connecting parts and an L-shaped removing part.

The whole part of the securing element. is formed by punching and pressing a stainless spring steel. The middle pressing part is folded at an angle to have a pressing point on a lower side, and has a pair of anti-skid protrusions sticking sideways therefrom.

The first and the second connecting parts are formed at two end of the middle part, and each has a connecting hole. The L-shaped removing part sticks out from a lower-end of the second connecting part, and is pivoted upwards to abut the second connecting part in an inverted position with a third connecting hole thereof communicating with the second part communicating hole. The removing part has a pair of fixing wings bent towards the second connecting part to fix same to the second part. The removing part has a moved portion on a top at the inverted position.

To use the securing equipment, the CPU is fitted onto a socket, and the heat dissipator is disposed on the CPU. Then, the first part hole, and the second and the third connecting holes engage a respective one of two end fixing protrusions of the socket with the pressing point pressing the heat dissipator. To remove the securing equipment, the moved portion is depressed and pushed towards the middle part for the second and third holes to disengage the corresponding fixing protrusion. The anti-skid protrusions will pass through between radiating fins of the heat dissipator to prevent the equipment from moving back and forth on the heat dissipator.

BRIEF DESCRIPTION OF THE DRAWINGS

This invention will be better understood by referring to the accompanying drawings, wherein.

DETAILED DESCRIPTION OF THE PREFERRED EMBODIMENT

Figure 1:
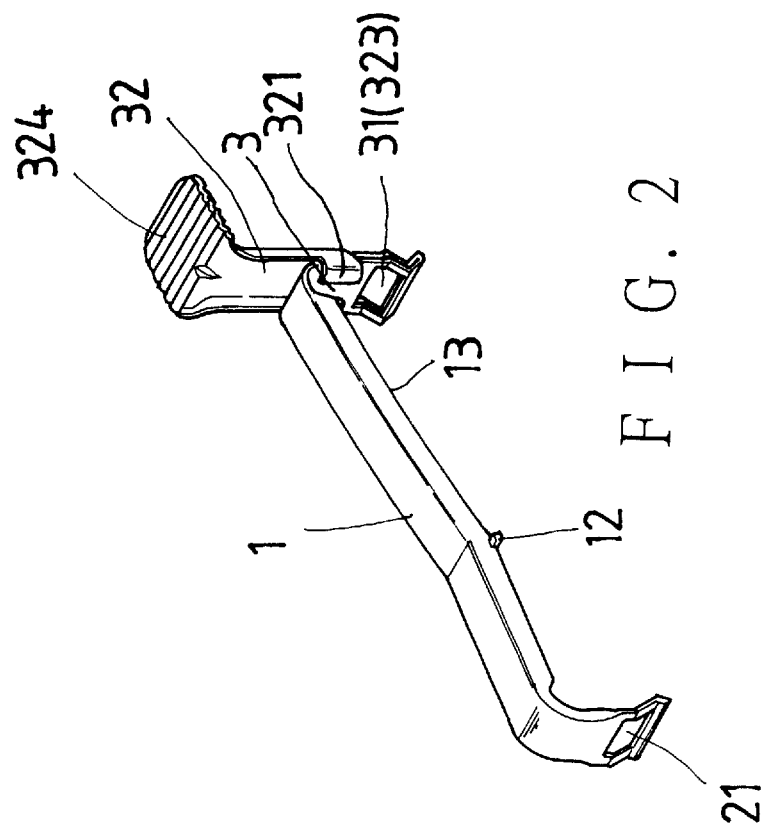
FIG. 1 is a perspective view of the securing equipment of the present invention with the removing part being not fixed in position.

Referring to FIG. 1, a securing member for heat dissipator of a CPU in the present invention includes a middle pressing part 1, a first connecting part 2 at one end of the middle part 1, both a second connecting part 3 and a removing part 32 at the other end. The securing equipment is made by pressing and punching a stainless spring steel, which forms the whole body thereof The first connecting part 2 has a connecting hole 21. The second connecting part 3 has a connecting hole 31 and an upper curved end portion 33 between the end of the middle pressing part 1 and the connecting hole 31.

The middle pressing part 1 is folded at an angle from a middle part thereof such that same has a middle pressing point 11, a curved portion between the second connecting part 3 and the pressing point 11 The middle pressing part 1 is provided with lateral walls sticking down from two longthuise forming edges so that same is strengthened. The curvature of the curved portion 13 can be changed in order for the securing equipment to lock the heat dissipator with a desired force. The middle pressing part 1 further has two anti-skid protrusions 12 near the pressing point 11, each sticking sideways from one of the lateral walls.

The upper curved end portion 33 of the second connecting part 3 doesn't have lateral walls like the middle pressing part 1 so that it is flexible enough for permitting the second connecting part 3 to be easily moved to a desired position for connection to a corresponding part of a computer.

Figure 2:
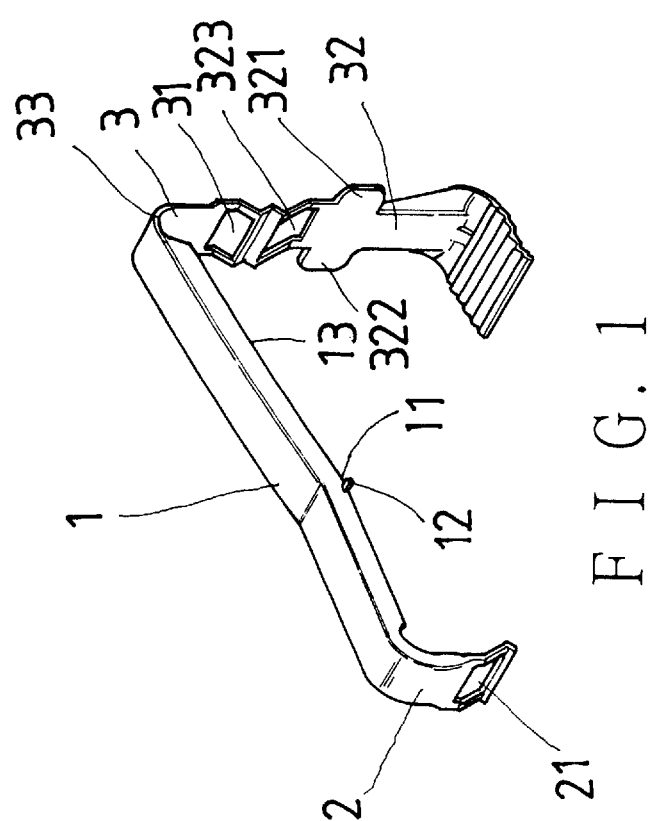
FIG. 2 is a perspective view of the securing equipment of the present invention with the removing part being fixed in position.
Figure 3:
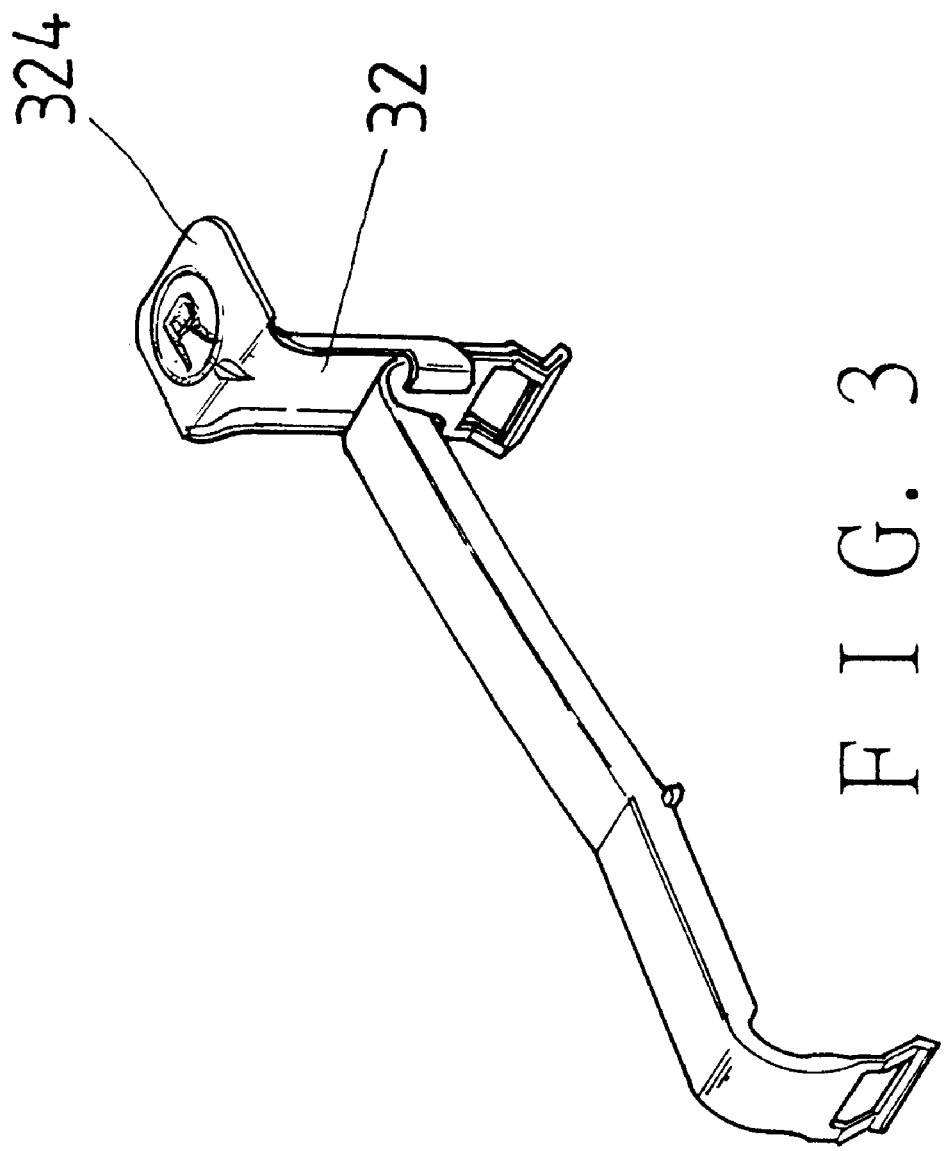
FIG. 3 is a perspective view of the securing equipment of the present invention with a trademark printed thereon.

The removing part 32 is formed under second connecting part 3, and substantially has an L-shaped, and has a moved portion 324. The removing part 32 has an outer connecting hole 323 and a pair of fixing wing parts 321. Referring to FIG. 2., the removing part 32 can be pivoted upwards to get into contact with the second connecting part 3 with the outer connecting hole 323 communicating with the connecting hole 31; the fixing wing parts 321 are folded towards the second connecting part 3 in order to fix the removing part 32 to the second connecting part 3. Thus, the moved portion 324 points upwards. Referring to FIG. 3, trademarks can be printed on the upper side of the moved portion 324.

Figure 4:
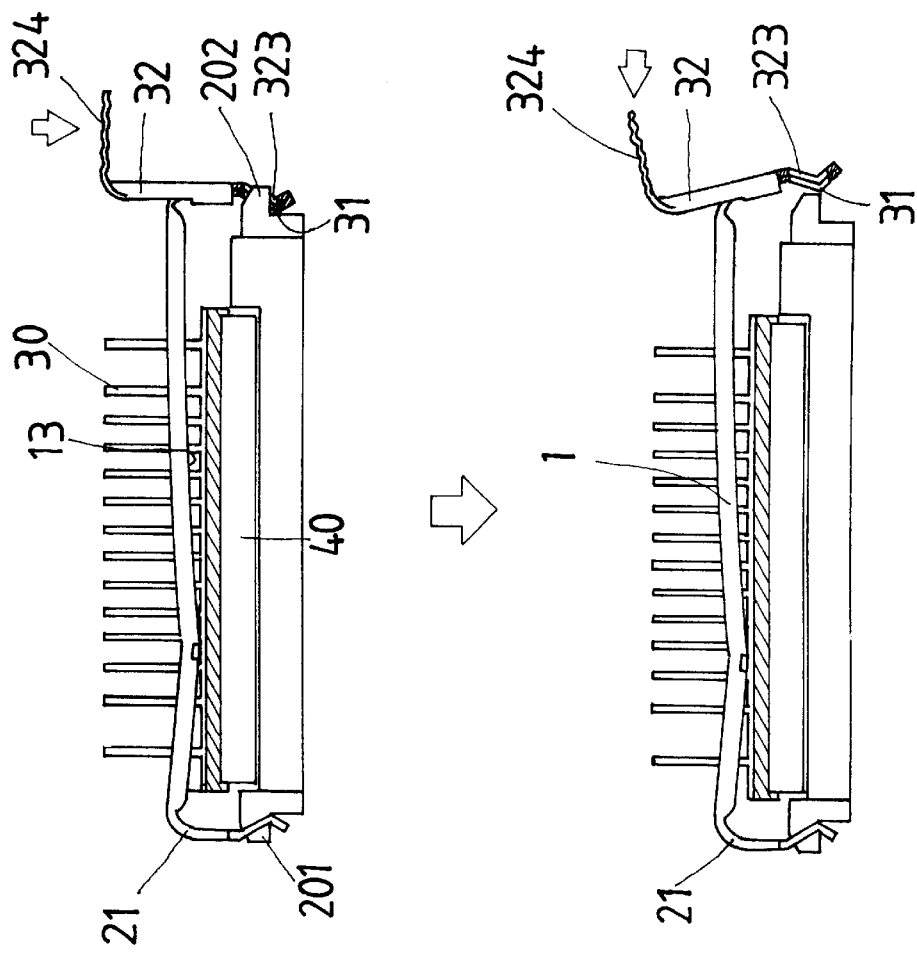
FIG. 4 is a top view of the securing equipment in FIG. 2 at a locking position on the heat dissipator.
Figure 5:
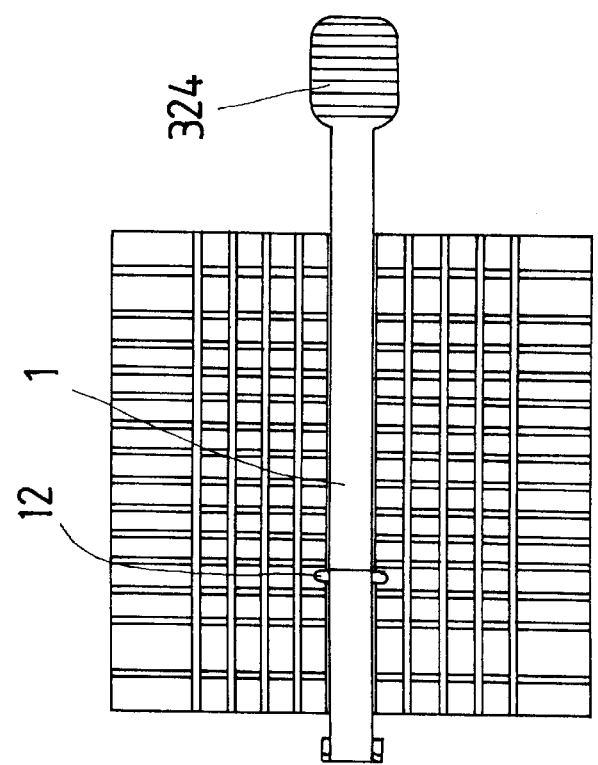
FIG. 5 is a view illustrating the removal movement of the securing equipment of FIG. 1 from the CPU socket.
Figure 6:
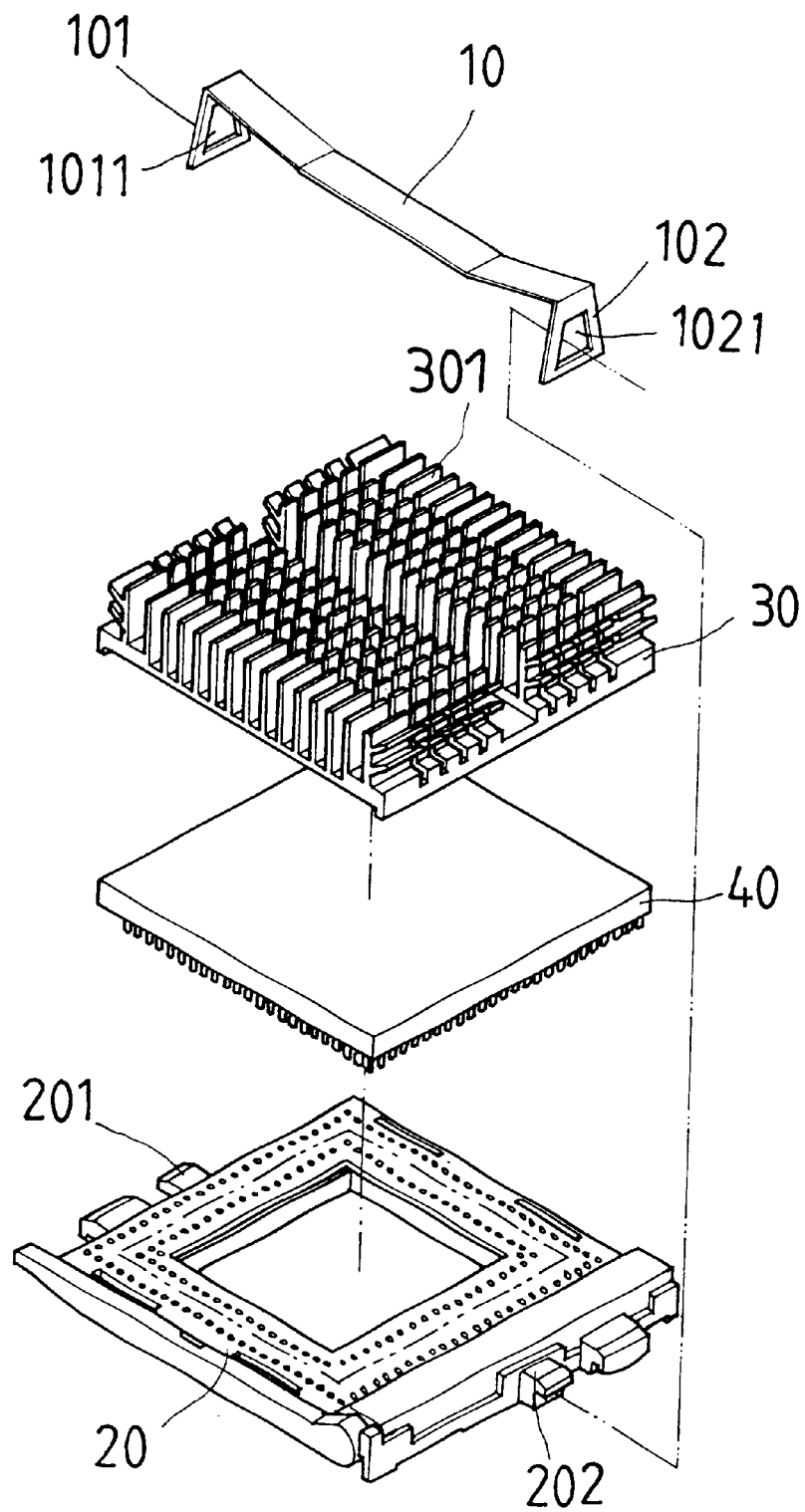
FIG. 6 is an exploded perspective view of the first conventional securing equipment and the related parts in a computer.
Figure 7:
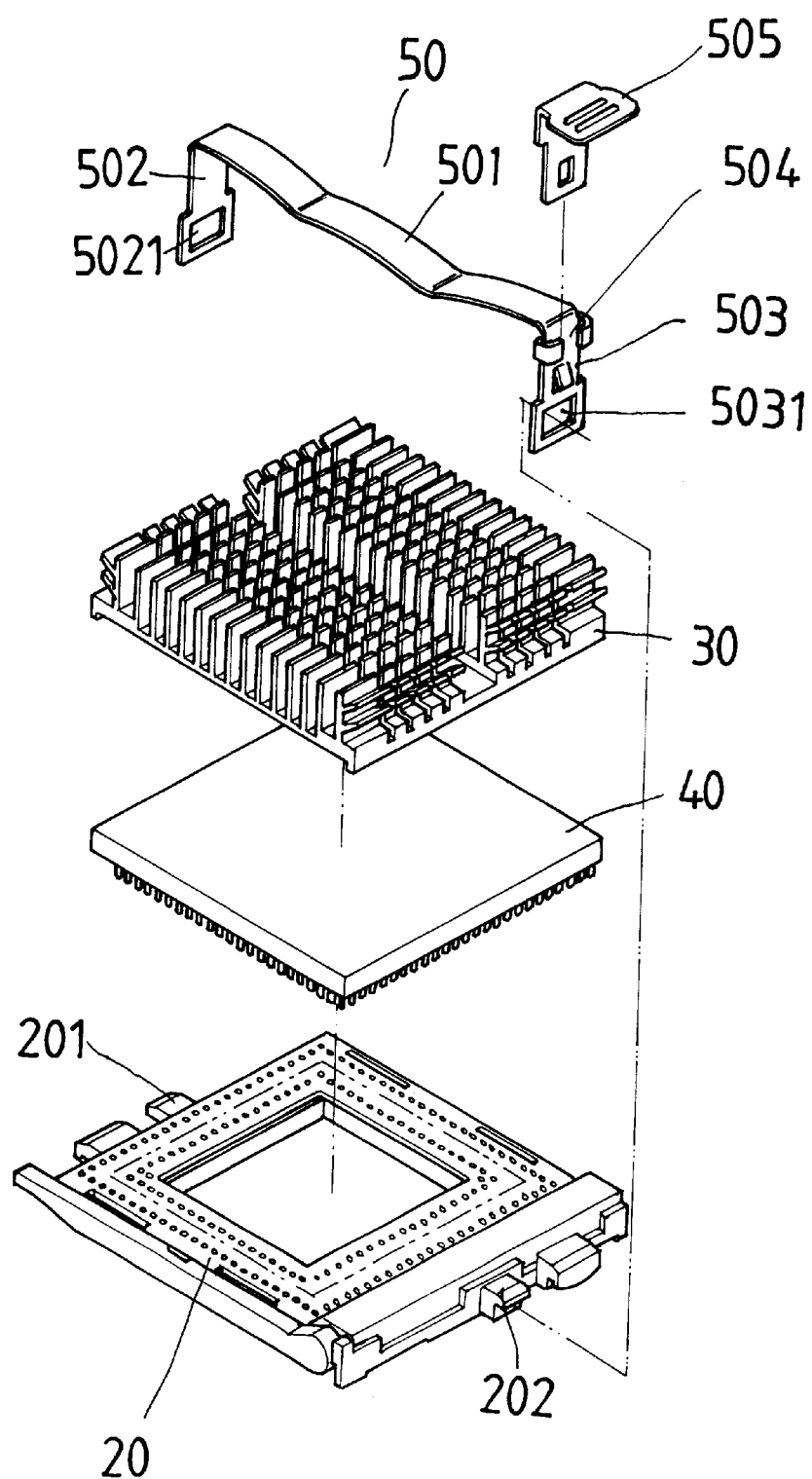
FIG. 7 is an exploded perspective view of the second conventional securing equipment and the related computer parts as described in the Background.

To use the securing equipment for fixing a heat dissipator, the first connecting hole 21 is connected to a fixing protrusion 201 of a socket 20, which a CPU is fitted to. And, the middle pressing part 1 is disposed on a passage on a heat dissipator 30, which is disposed on the upper side of the CPU 40, and which has several lines of radiating fins (not numbered) sticking up therefrom. The anti-skid protrusion 12 will be disposed between the radiating fins of the heat dissipator 30 to prevent the securing equipment from moving along the passage as shown in FIG. 4. Then, the moved portion 324 at the other end is depressed to connect both the connecting holes 31 and 323 to a fixing protrusion 202 of the socket 20. Thus, the middle pressing point 11 of the pressing part 1 presses the heat dissipator 30 for the same and the CPU 40 to be fixed to the socket 20.

To remove the securing equipment for permitting the heat dissipator and CPU to be removed, the moved portion 324 is depressed and pushed towards the middle part 1 to move the connecting holes 31 and 323 from the protrusion 202; thus, the connecting holes 31 and 323 separate from the protrusion 202 of the socket 20, permitting the securing equipment to be removed.

From the above description, it can be understood that the securing equipment for a heat dissipator of a CPU in the present invention has desirable features as follows:

1. The whole body of the securing equipment is formed in punching and pressing a stainless spring steel, and no assembly is needed in the manufacturing. Therefore, the labor cost of manual assembly is saved. Furthermore, the securing equipment can be removed from the fixing protrusions the socket 20 by simply depressing and pushing the moved portion 324. Therefore, the risk of the securing equipment and the socket 20 getting damaged by a screwdriver is eliminated.
2. The securing equipment doesn't need a heat treatment, which might cause deformation thereof because it is made of stainless spring steel.

What is claimed is:

1. A securing equipment for a heat dissipator of a CPU, comprising a middle pressing part, said pressing part being folded at an angle to have a middle pressing point on a lower side;

a first connecting part formed at one end of said middle pressing part; said first connecting part having a first ocnnecing hole;

a second connecting part formed at other end of said middle pressing part; said second part having a second connecting hole;

and characterized by an L-shaped removing part, said removing part sticking out from a lower end of said second connecting part; said removing part being pivoted upwards to abut said second connecting part in an inverted-L shape with a third connecting hole thererof communicating with said second connecting hole; said removing part having a pair of fixing wing parts bent towards said second connecting part to fix same to said second connecting part; said removing part having a moved portion on a top at said inverted position; whereby a heat dissipator of a CPU can be fixedly disposed on an upper side of said CPU by means of disposing said pressing point of said middle pressing part on said heat dissipator and connecting said first and said second connecting holes to a respective one of fixing protrusions of two ends of a socket, which said CPU is fitted onto; said securing element being removed by means of pressing said moved portion, and pushing same inwardly of said middle pressing part to separated said second and said third connecting holes from said fixing protrusion.

2. The securing equipment for a heat dissipator of a CPU as claimed in claim 1, wherein said middle pressing part is provided with lateral walls sticking down from two lengthwise forming edges thereof for strengthening same; said lateral walls each having an anti-skid protrusion sticking out sideways to be disposed between radiating fins of said heat dissipator for preventing said securing equipment from moving back and forth.

3. The securing equipment for a heat dissipator of a CPU as claimed in claim 1, wherein said middle pressing part has a curved portion between said pressing point and said second connecting part; a curvature of said curved portion being capable of being changed for adjusting a locking force of said securing equipment on said heat dissipator.

4. The securing equipment for a heat dissipator of a CPU as claimed in claim 1, wherein said moved portion is provided with a trademark on a top side thereof.

5. A securing equipment for a heat dissipator of a CPU as claimed in claim 1 being made of stainless spring steel.

* * * * *